United States Patent
Andrews et al.

(10) Patent No.: US 7,547,995 B1
(45) Date of Patent: Jun. 16, 2009

(54) DYNAMIC OVER-VOLTAGE PROTECTION SCHEME FOR INTERFACE CIRCUITRY

(75) Inventors: William B. Andrews, Emmaus, PA (US); Larry R Fenstermaker, Nazareth, PA (US); John A. Schadt, Bethlehem, PA (US); Mou C. Lin, High Ridge, NJ (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 401 days.

(21) Appl. No.: 11/345,713

(22) Filed: Feb. 2, 2006

(51) Int. Cl.
 *H01H 9/54* (2006.01)
(52) U.S. Cl. ...................... 307/140; 326/62
(58) Field of Classification Search ............. 307/80, 307/140; 365/189.09; 327/530, 541; 326/80, 326/62
 See application file for complete search history.

(56) References Cited

U.S. PATENT DOCUMENTS

| | | | | |
|---|---|---|---|---|
| 5,160,855 A | | 11/1992 | Dobberpuhl | 307/270 |
| 5,402,375 A | * | 3/1995 | Horiguchi et al. | 365/189.09 |
| 5,486,777 A | | 1/1996 | Nguyen | 326/68 |
| 5,493,657 A | | 2/1996 | Van Brunt et al. | 395/308 |
| 5,574,389 A | | 11/1996 | Chu | 326/81 |
| 5,646,550 A | | 7/1997 | Campbell, Jr. et al. | 326/81 |
| 5,778,204 A | | 7/1998 | Van Brunt et al. | 395/308 |
| 5,933,025 A | | 8/1999 | Nance et al. | 326/81 |
| 5,933,027 A | | 8/1999 | Morris et al. | 326/81 |
| 5,963,053 A | | 10/1999 | Manohar et al. | 326/630 |
| 6,028,450 A | | 2/2000 | Nance | 326/81 |
| 6,034,551 A | | 3/2000 | Bridgewater, Jr. | 326/82 |
| 6,064,231 A | | 5/2000 | Kothandaraman et al. | 326/83 |
| 6,313,661 B1 | | 11/2001 | Hsu | 326/81 |
| 6,344,958 B1 | | 2/2002 | Morrill | 361/91.5 |
| 6,362,665 B1 | | 3/2002 | Davis et al. | 327/108 |
| 6,377,112 B1 | | 4/2002 | Rozsypal | 327/534 |
| 6,462,852 B1 | | 10/2002 | Paschal et al. | 359/189 |
| 6,538,867 B1 | | 3/2003 | Goodell et al. | 361/91.1 |
| 6,700,823 B1 | | 3/2004 | Rahman et al. | 365/189.05 |
| 6,784,568 B2 | * | 8/2004 | Powers | 307/66 |
| 6,788,101 B1 | | 9/2004 | Rahman | 326/30 |
| 7,046,074 B2 | | 5/2006 | Jang | 327/534 |
| 2006/0119416 A1 | * | 6/2006 | Fung et al. | 327/530 |
| 2007/0241618 A1 | * | 10/2007 | Xu | 307/80 |

FOREIGN PATENT DOCUMENTS

WO WO 2005088804 A1 * 9/2005

* cited by examiner

*Primary Examiner*—Albert W Paladini
*Assistant Examiner*—Daniel Cavallari
(74) *Attorney, Agent, or Firm*—Mendelsohn & Associates, P.C.

(57) ABSTRACT

In one embodiment of the invention, an integrated device has interface circuitry that includes a dynamic monitor that monitors the relative potential between (at least) two different power supplies to enable the device to react to over-voltage conditions such that appropriate selections can be made for which power supplies are selected for different components in the interface circuitry, such as output drivers and input receivers. The dynamic monitor enables over-voltage protection to be automatically implemented before the device has been configured, such as during the device's power-on state.

9 Claims, 9 Drawing Sheets

TABLE I

| AUXGTIO | 908 | AUXGTION | ND1 | NR1 | MN2 | MN4 | MN6 | MP1 | MP2 | MP3 | MP4 | MP5 | MP6 | 1002 | 1006 | 912 |
|---|---|---|---|---|---|---|---|---|---|---|---|---|---|---|---|---|
| high | high | low | low | high | on | off | on | off | on | on | off | off | off | gnd | vccaux | gnd |
| high | low | low | high | low | on | on | off | off | off | on | off | on | off | gnd | gnd | vccaux |
| low | high/low | high | low | low | off | off | off | on | on | off | on | off | on | vccio | vccio | vccio |
| | | | | | | | | | | | | | | | | vccio |

FIG. 11

DYNAMIC OVER-VOLTAGE PROTECTION SCHEME FOR INTERFACE CIRCUITRY

CROSS-REFERENCE TO RELATED APPLICATIONS

The subject matter of this application is related to the subject matter in U.S. patent application Ser. No. 11/007,954, filed Dec. 9, 2004, and U.S. patent application Ser. No. 11/189,067, filed Jul. 25, 2005, the teachings of both of which are incorporated herein by reference.

TECHNICAL FIELD

The present invention relates to integrated circuitry, and, in particular, to techniques for protecting integrated devices from over-voltage conditions at the device's input/output (I/O) interfaces.

BACKGROUND

As device input and output performance (e.g., speed) requirements increase, technology changes to meet these requirements. Increased transistor performance is typically achieved by reducing the gate-oxide thickness and shortening the channel length via lithographic size reduction. One of the disadvantages of a thinner gate-oxide layer is reduced transistor voltage tolerance. In general, the greater the performance that a transistor is designed to achieve, the lower the voltage that the transistor can tolerate. Effects such as hot-carrier injection and gate-oxide breakdown are the cause of signal and supply limitations on faster devices.

One possible approach to handling over-voltage conditions would be to implement I/O circuits with slower transistors having higher voltage tolerance. Unfortunately, this reduces the bandwidth of signal interfaces that the I/O circuits can successfully accommodate.

Another approach is to use programmable protection. Since this type of protection is changeable by programming, it is limited to a specific mode of operation before the device is configured. Unfortunately, this type of power supply selection and protection can lead to non-optimal performance, power, and signal disturbance issues before the device is configured, since the device I/O circuits can be optimized for only a minimal set of conditions. When those conditions are not met, the I/O circuits may cause surges in pad current and power supply current or actual part failure.

I/O circuits are preferably versatile enough to meet all of the performance requirements of numerous interface standards, including hot-plug and power-sequencing requirements, and be voltage tolerant before the device is programmed. Prior-art circuits use numerous power supplies and different circuit sections for different signaling applications. This leads to inefficiencies when one or more of the different signaling applications, and therefore one or more of the corresponding different circuit sections, are not utilized.

SUMMARY

In one embodiment, the present invention is an integrated device having an interface circuit comprising a monitor and at least one switch module. The monitor dynamically compares first and second power supplies in order to generate a dynamic control signal. The at least one switch module selects, based on the dynamic control signal, one of the first and second power supplies for use in powering at least one input/output (I/O) component of the interface circuit.

In another embodiment, the present invention is a method for operating an interface circuit of an integrated device. First and second power supplies are dynamically compared in order to generate a dynamic control signal. One of the first and second power supplies is selected, based on the dynamic control signal, for use in powering at least one I/O component of the interface circuit.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 11 contains Table I, which shows the signal levels, gate outputs, and transistor states for the different operating scenarios for the circuitry of FIG. 10.

DETAILED DESCRIPTION

Figure 1:
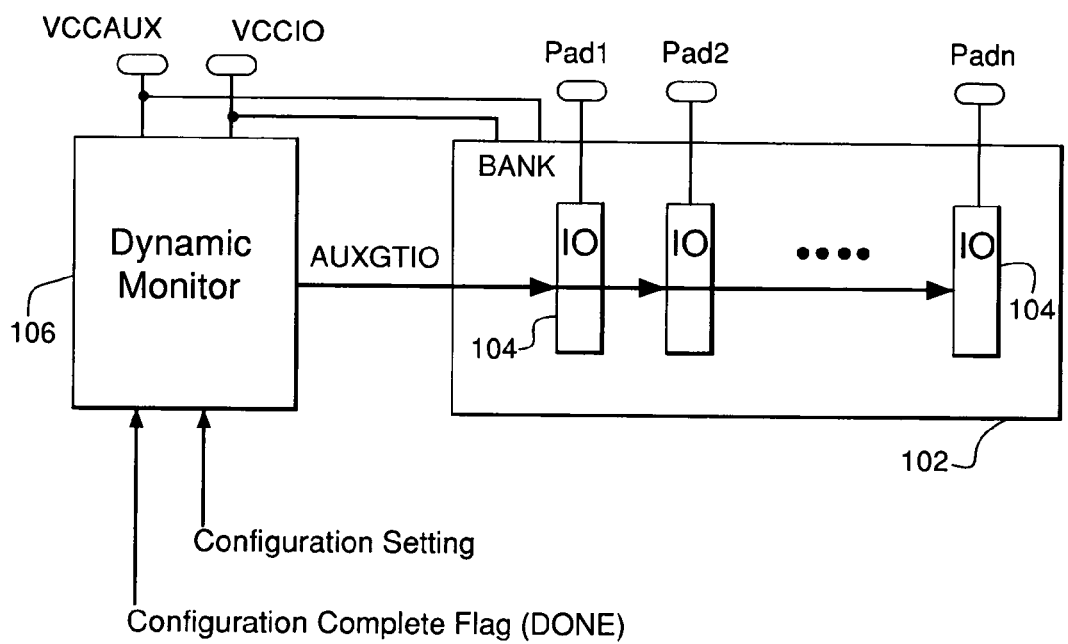
FIG. 1 shows a block diagram of an interface circuit of an integrated device, according to one embodiment of the present invention.

FIG. 1 shows a block diagram of an interface circuit 100 of an integrated device, according to one embodiment of the present invention, in which the integrated device may have one or more instances of interface circuit 100 for one or more sets of I/O pads on the device. Interface circuit 100 includes (1) a bank 102 of one or more programmable I/O buffers 104 (one I/O buffer per signaling pad) that share the same power supplies (e.g., VCCAUX and VCCIO) and (2) a dynamic monitor 106 designed to provide dynamic over-voltage protection for the I/O buffers. Dynamic monitor 106 monitors power supply voltage levels to automatically determine the optimal circuit configuration for the I/O buffers before the device has been programmed, where the programmable buffers use a programmable circuit configuration after the device has been configured. By monitoring the supply voltages for multiple input and output signals, a single monitoring circuit 106 can be used to determine the configuration state for proper operation of a number of different I/O buffers 104, thereby making efficient use of silicon area. Dynamic monitor 106 sends at least one digital control signal (AUXGTIO) to all the I/O buffers so that each can be configured to meets its individual requirements. Dynamic monitor 106 can be designed to enable the I/O buffers to meet a wide range of high-speed, over-voltage environment configurations, power surges, and hot-plug (i.e., hot-socket) requirements.

Interface circuit 100 enables the I/O buffers to be built with low-voltage-tolerant transistors to achieve high performance and yet still be capable of being tolerant to certain high-voltage operating condition environments. Interface circuit 100 can also meet hot-plug requirements. In order for a part to be considered hot-plug compatible, it must not draw enough pad current to disturb any busses in the system into which it is being plugged.

An integrated device may use different sections of circuitry for operation in different power-supply and signaling environments. In order for the different circuit sections to be used properly, the power-supply and signaling environment should be known. There are two ways interface circuit 100 of FIG. 1 identifies the power-supply or signaling environment for its particular section of device circuitry. The first is dynamically with power-supply monitoring; the second is with configuration settings.

In general, a programmable circuit has three states of operation. The first state is power-on, when the power supply pins are powered from an undriven floating or grounded state to the required supply operating condition potentials. The second state is after the power supplies have reached their required operating potentials, but before the circuit has completed its configuration. The third state is after the circuit has completed its configuration and is ready for functional operation.

In the first and second states, interface circuit 100 uses dynamic power-supply monitoring to achieve over-voltage protection. Such monitoring is needed during the power-on state because the relative potential of the power supplies is unknown. Such monitoring is also needed during the second state, because the circuit has not yet been configured with programmable information about the power supplies. For the third state of operation, interface circuit 100 uses configured information to set power-supply switches and protection appropriately.

I/O circuits, such as I/O buffers 104 of FIG. 1, are typically associated with multiple power supplies. One supply, the I/O output driver supply (VCCIO in FIG. 1), is used to drive the push-pull output drivers and should supply enough current to meet the output driver's supply requirements. The VCCIO supply is also used to power input ratio (i.e., single-ended) receivers and any other miscellaneous logic deemed necessary by the circuit designer.

Another supply used for I/O circuits is the pre-driver supply voltage (VCCAUX in FIG. 1), also called the auxiliary supply. The VCCAUX supply is typically the optimal voltage for the transistors in the I/O circuit at a specific voltage on the die. The VCCAUX supply does not supply as much switching current as the VCCIO supply and tends to be more quiet. As such, it may also be used as a supply on higher-speed differential drivers and receivers and reference-type receivers.

I/O circuits also typically include one or more other supplies for level-shifting to interface with the core logic.

Different sections of the I/O circuits are supplied by different voltages. To meet different I/O interface standards, the VCCIO supply level is typically changeable, while the VCCAUX supply level is substantially constant. As the relative voltage levels between these two supplies change, the characteristics of the circuits change. By monitoring the relative voltage levels of these two supplies, the circuit characteristics can be appropriately controlled.

As indicated in FIG. 1, dynamic monitor 106 compares the voltage levels of the VCCIO and the VCCAUX supplies, generates the AUXGTIO control signal based on that comparison, and transmits that control signal to each of I/O buffers 104 to enable them to ensure hot-plug requirements, power-sequence requirements, performance needs, and circuit protection. As the supply levels transition from unknown, grounded, or floating states to their respective operating levels, their relative potential may change one or more times.

Figure 2:
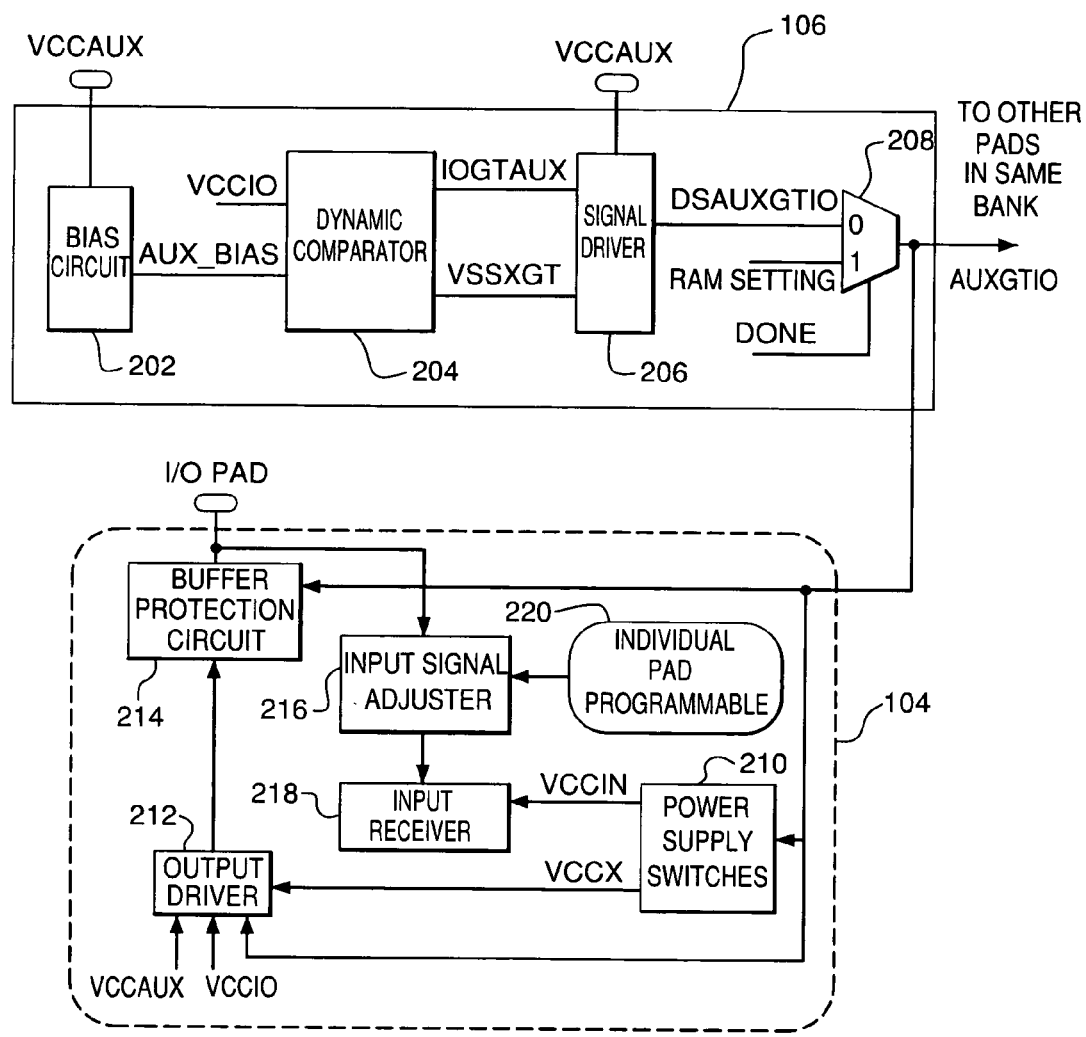
FIG. 2 shows a block diagram of the dynamic monitor and one I/O buffer in the interface circuit of FIG. 1.

FIG. 2 shows a block diagram of dynamic monitor 106 and one I/O buffer 104 of FIG. 1. As shown in FIG. 2, dynamic monitor 106 includes bias circuit 202, dynamic comparator 204, signal driver 206, and 2:1 multiplexer (mux) 208, while I/O buffer 104 includes power supply switch module 210, output driver 212, buffer protection circuit 214, input signal adjuster 216, and input receiver 218.

Within dynamic monitor 106, bias circuit 202 generates a switch-point voltage level (AUX_BIAS) relative to the VCCAUX supply, where AUX_BIAS is the level used by dynamic comparator 204 as a relative switch point to the VCCIO supply.

Dynamic comparator 204 receives two inputs (the VCCIO supply level and the AUX_BIAS signal) and generates two outputs (the IOGTAUX signal and the VSSXGT signal) having their logic-high states based on the VCCIO supply level. Dynamic comparator 204 monitors the relative potential of the VCCIO power supply to the AUX_BIAS signal. By using the AUX_BIAS signal, the dynamic comparator is able to determine when the VCCIO supply level is greater than the VCCAUX supply level by some predetermined amount. In one implementation, device sizing is used to control the magnitude of that predetermined amount. If VCCIO is sufficiently greater than VCCAUX, then the IOGTAUX signal is at logic high (1) and the VSSXGT signal is at logic high (1). If the VCCIO is not sufficiently greater than VCCAUX, then the IOGTAUX signal is at logic low and the VSSXGT signal is at logic low.

Signal driver 206 is a low-power output-signal generator that receives the IOGTAUX and VSSXGT control signals from dynamic comparator 204 as well as the VCCAUX supply and generates a control signal DSAUXGTIO having its logic-high state based on the VCCAUX supply level. Signal driver 206 acts as a level-shifting section by shifting the output from VCCIO-powered dynamic comparator 204 to the VCCAUX level. When VCCIO is sufficiently greater than VCCAUX, then the output signal DSAUXGTIO is at logic low; otherwise, DSAUXGTIO is at logic high. As described below in more detail with reference to FIG. 5, by using a weak feedback pull-up transistor (P3), the output transistor (P2) in signal driver 206 can be fully switched off, thereby saving power when DSAUXGTIO is low.

Mux 208 receives (1) the DSAUXGTIO control signal and a configuration RAM setting at its two input ports and (2) control signal DONE at its control port and outputs one of the two inputs based on the value of the DONE signal. If DONE is low (indicating that configuration of the IC device has not yet been completed), then mux 208 outputs DSAUXGTIO as the dynamic monitor's output signal AUXGTIO. If DONE is high (indicating that configuration of the IC device has been completed), then mux 208 outputs the configuration RAM setting as the dynamic monitor's output signal AUXGTIO.

Within I/O buffer 104, power supply switch module 210 receives the control signal AUXGTIO from dynamic monitor 106 and generates two power supply signals: VCCX used to power output driver 212 and VCCIN used to power input receiver 218. Buffer protection circuit 214, which also receives control signal AUXGTIO, is connected between output driver 212 and the corresponding I/O pad to provide over-voltage protection to the output driver. Similarly, input signal adjuster 216, which receives configuration settings 220, is connected between the I/O pad and input receiver 218 to provide over-voltage protection to the input receiver. Depending on the particular implementation, configuration settings 220 can be set by RAM or dynamically similar to the AUXGTIO implementation.

Figure 3:
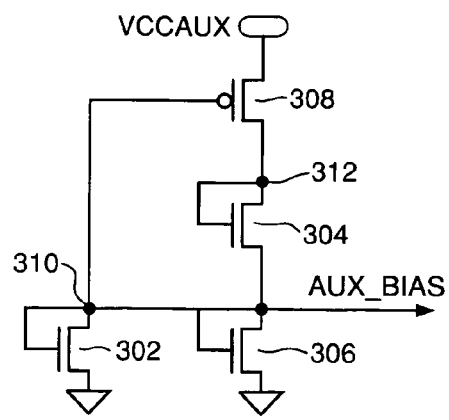
FIG. 3 shows a schematic circuit diagram of the bias circuit in the dynamic monitor of FIG. 2.

FIG. 3 shows a schematic circuit diagram of bias circuit 202 of FIG. 2, according to one possible implementation in which bias circuit 202 includes three diode-connected NFETs (n-type field-effect transistors) 302-306 and one PFET (p-type FET) 308. As configured, NFET 302 ensures that node 310 is low, which keeps PFET 308 on and node 312 at a voltage equal to VCCAUX minus the voltage drop across PFET 308. Depending on the size of that voltage drop, the voltage at node 312 will be high enough to turn NFET 304 at least partially on, where the voltage level at output node AUX_BIAS is equal to VCCAUX minus the voltage drops across PFET 308 and NFET 304. The sizes of the NFETs used to form the diodes are selected to achieve a desired bias point for AUX_BIAS (i.e., at a predetermined amount below VCCAUX).

Figure 4:
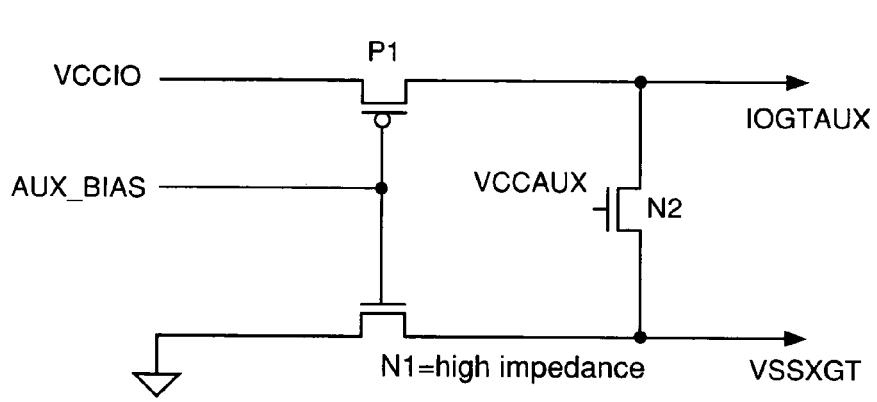
FIG. 4 shows a schematic circuit diagram of the dynamic comparator in the dynamic monitor of FIG. 2.

FIG. 4 shows a schematic circuit diagram of dynamic comparator 204 of FIG. 2, according to one possible implementation in which dynamic comparator 204 includes one PFET P1 and two NFETs N1 and N2. Transistor P1 compares the bias voltage AUX_BIAS to VCCIO. Transistors N1 and N2 are always on (i.e., whenever AUX_BIAS and VCCAUX, respectively, are sufficiently high). Transistor N1 has a sufficiently high impedance such that transistor P1 can pull both IOGTAUX and VSSXGT high, when all three transistors are on. If VCCIO is greater than AUX_BIAS by the threshold voltage of transistor P1, then the IOGTAUX signal and the VSSXGT signal go to logic high. If VCCIO is less than the P1 threshold voltage above AUX_BIAS, then transistor P1 is off and the IOGTAUX signal and the VSSXGT signal are at logic low. VSSXGT follows the IOGTAUX signal level, but has a maximum voltage of VCCAUX minus the threshold voltage of transistor N2. As such, when IOGTAUX is high, VSSXGT is also high, but VSSXGT does not exceed the voltage tolerance of the NFET devices N1 or N2. Limiting VSSXGT also protects downstream circuitry, such as transistor N3 of FIG. 5. The current and therefore the power can be reduced by increasing the resistance of transistor N1, e.g., by designing N1 with a long channel length.

Figure 5:
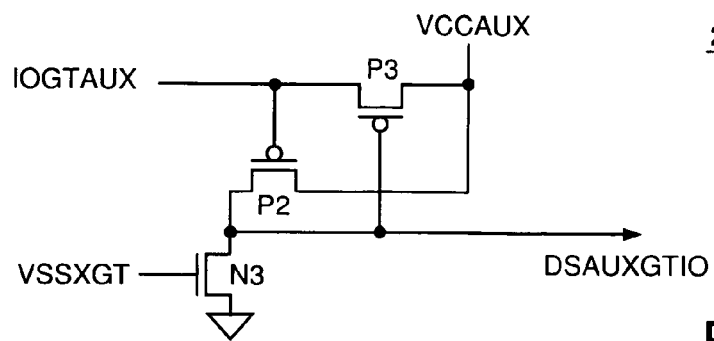
FIG. 5 shows a schematic circuit diagram of the signal driver in the dynamic monitor of FIG. 2.

FIG. 5 shows a schematic circuit diagram of signal driver 206 of FIG. 2, according to one possible implementation in which signal driver 206 includes two PFETs P2 and P3 and one NFET N3, where pull-up PFET P3 is weaker than output PFET P2. If IOGTAUX and VSSXGT are both high, then P2 will be off and N3 will be on, which drives output signal DSAUXGTIO low, which in turn turns P3 on, thereby helping ensure that P2 will stay off. If IOGTAUX and VSSXGT are both low, then P2 will be on and N3 will be off, which drives output signal DSAUXGTIO high (at the VCCAUX supply level), which in turn ensures that P3 is off.

Figure 6:
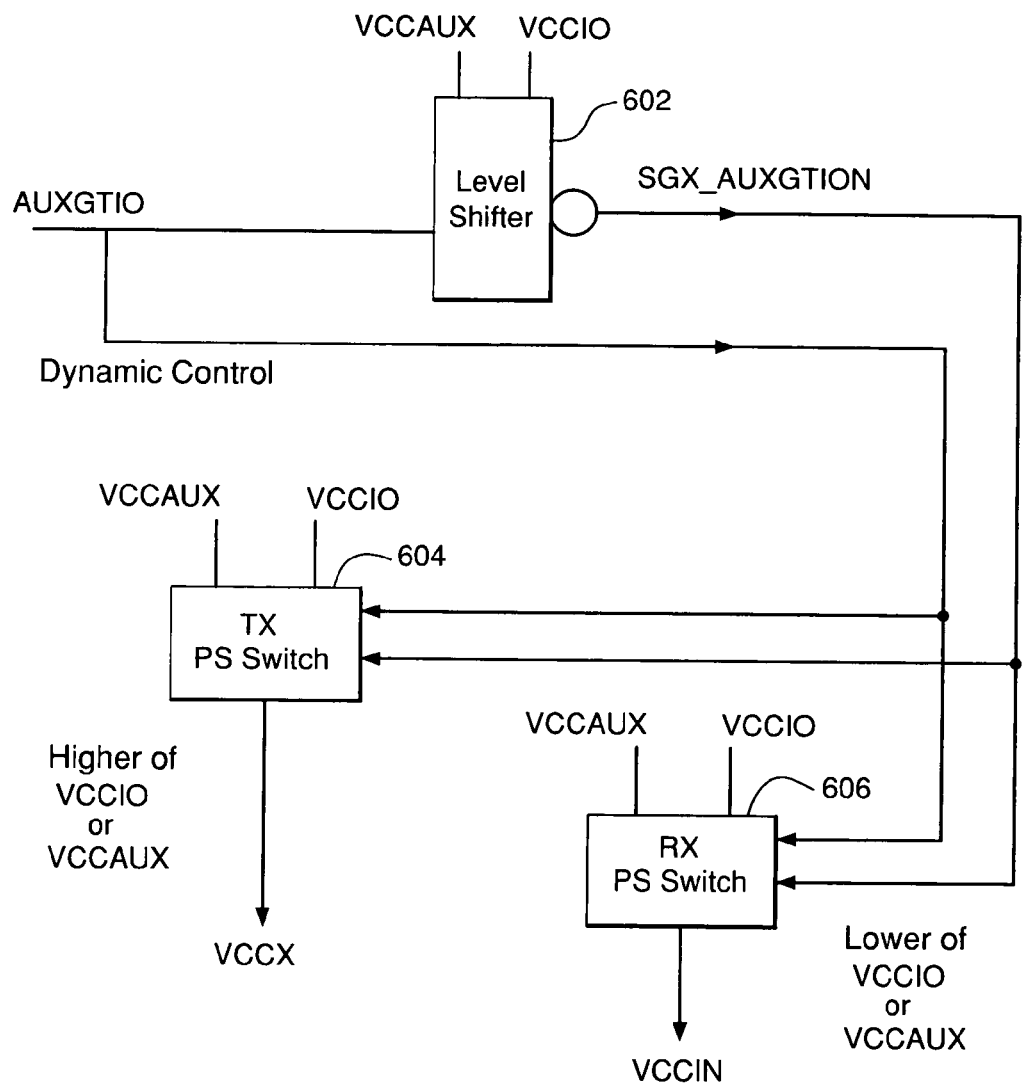
FIG. 6 shows a schematic block diagram of the power supply switch module in the I/O buffer of FIG. 2.

FIG. 6 shows a schematic block diagram of power supply switch module 210 of FIG. 2, according to one possible implementation. As described previously, switch module 210 selects the appropriate power supplies to apply to output driver 212 and input receiver 218. Switch module 210 includes inverting level shifter 602, output-driver, power-supply (TX PS) switch 604, and input-receiver, power-supply (RX PS) switch 606.

Inverting level shifter 602 receives power supplies VCCAUX and VCCIO and dynamic control signal AUXGTIO from dynamic monitor 106 of FIG. 1 and generates inverted, level-shifted control signal SGX_AUXGTION. TX PS switch 604 receives power supplies VCCAUX and VCCIO and control signals AUXGTIO and SGX_AUXGTION and generates power supply VCCX for output buffer 212. Similarly, RX PS switch 606 receives power supplies VCCAUX and VCCIO and control signals AUXGTIO and SGX_AUXGTION and generates power supply VCCIN for input receiver 218.

Figure 7:
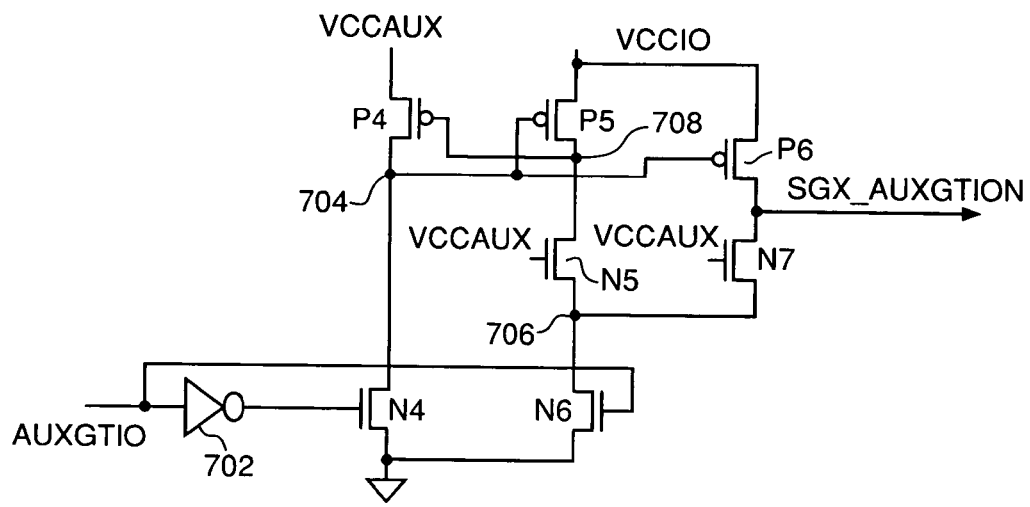
FIG. 7 shows a schematic circuit diagram of the inverting level shifter in the switch module of FIG. 6.

FIG. 7 shows a schematic circuit diagram of inverting level shifter 602 of FIG. 6, according to one possible implementation, in which inverting level shifter 602 includes PFETs P4-P6, NFETs N4-N7, and inverter 702. During the power-on state, as VCCAUX and VCCIO ramp up to their operating potentials, the devices in inverting level shifter 602 turn on and off depending on the value of AUXGTIO and the relative potential between VCCAUX and VCCIO. Similarly, during the second state (i.e., after the power supplies have reached their required operating potentials, but before the circuit has completed its configuration), the state of inverting level shifter 602 will also depend on the value of AUXGTIO and the relative potential between VCCAUX and VCCIO.

As described previously in the context of FIGS. 1-5, if VCCIO is greater than VCCAUX by a predetermined amount (based on the sizes of certain transistors in bias circuit 202 and dynamic comparator 204 in dynamic monitor 106), then AUXGTIO will be low. If AUXGTIO is low, then N6 is turned off and inverter 702 drives N4 on. Turning on N4 drives node 704 low, which turns on P6, which allows VCCIO to drive output node SGX_AUXGTION high. Driving node 704 low also turns on P5, which enables VCCIO to drive node 706 high through P5 and N5 (which eventually turns on as VCCAUX ramps up). Driving node 706 high reinforces the driving of output node SGX_AUXGTION high through N7 (which also eventually turns on as VCCAUX ramps up). In this case, high SGX_AUXGTION will be an inverted, level-shifted (i.e., VCCAUX to VCCIO) version of low AUXGTIO.

On the other hand, if VCCIO is not greater than VCCAUX by the predetermined amount, then AUXGTIO, whose logic-high state is at a level based on VCCAUX, will be high. If AUXGTIO is high, then N6 is turned on and inverter 702 will turn N4 off. Turning on N6 drives node 706 low, which, in turn, drives output node SGX_AUXGTION low through N7 (which eventually turns on as VCCAUX ramps up). Driving node 706 low also drives node 708 low through N5 (which also eventually turns on as VCCAUX ramps up). Driving node 708 low turns on P4, which drives node 704 high as VCCAUX ramps up. Driving node 704 high ensures that P6 remains off, thereby shielding output node SGX_AUXGTION from VCCIO. In this case, low SGX_AUXGTION will be an inverted version of high AUXGTIO.

Those skilled in the art will understand that, as described in the previous two paragraphs, the circuitry of FIG. 7 functions as a level-shifting, cross-coupled latch.

Figure 8:
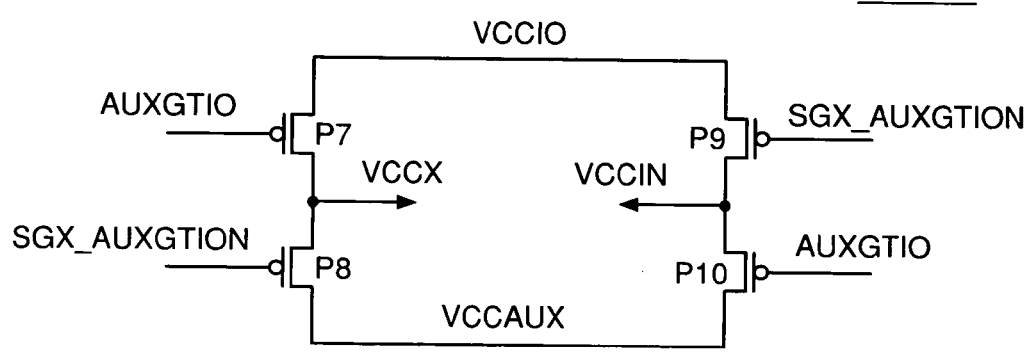
FIG. 8 shows a schematic circuit diagram of a combined implementation of the power-supply switches in the switch module of FIG. 6.

FIG. 8 shows a schematic circuit diagram of a combined implementation of power-supply switches 604 and 606 of FIG. 6, according to one possible implementation, in which the combined implementation includes four PFETs P7-P10. As discussed in the context of FIG. 7, if VCCIO is greater than VCCAUX by the predetermined amount, then VCCAUX-based AUXGTIO will be low and SGX_AUXGTION will be high. In that case, P8 and P9 will be off, P7 and P10 will be on, VCCAUX will be applied to output node VCCIN, and VCCIO will be applied to output node VCCX. In this case, where VCCIO is greater than VCCAUX by the predetermined amount, output driver 212 will be driven by a power supply (VCCX) that is based on VCCIO, and input receiver 218 will be driven by a power supply (VCCIN) that is based on VCCAUX.

On the other hand, if VCCIO is not greater than VCCAUX by the predetermined amount, then AUXGTIO will be high and VCCIO-based SGX_AUXGTION will be low. In that case, P8 and P9 will be on, P7 and P10 will be off, VCCAUX will be applied to output node VCCX, and VCCIO will be applied to output node VCCIN. In this case, where VCCIO is not greater than VCCAUX by the predetermined amount, output driver 212 will be driven by a power supply (VCCX) that is based on VCCAUX, and input receiver 218 will be driven by a power supply (VCCIN) that is based on VCCIO.

In this way, power-supply switches 604 and 606 ensure that VCCX is always the higher of VCCIO and VCCAUX, and VCCIN is always the lower of VCCIO and VCCAUX.

Figure 9:
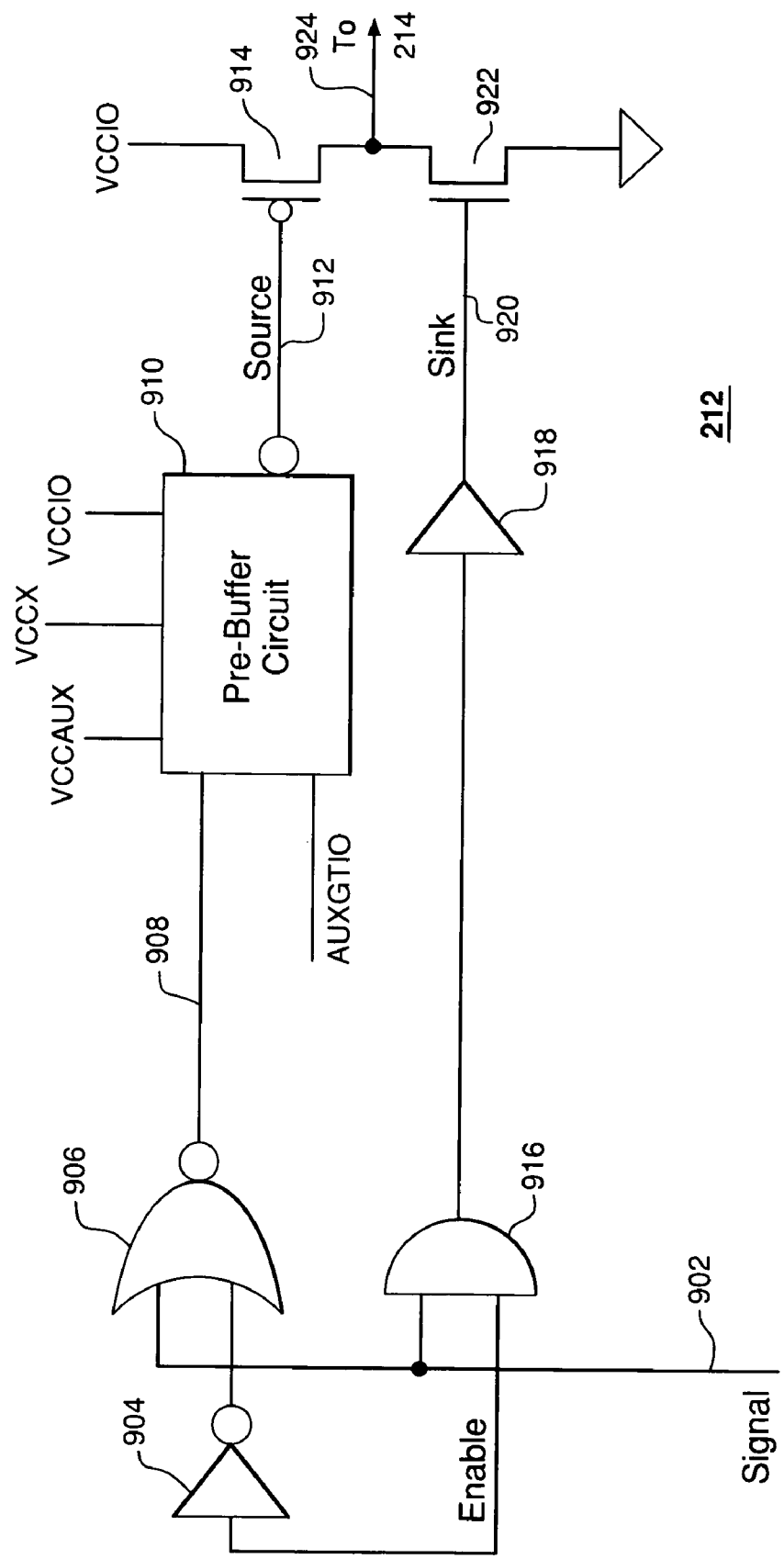
FIG. 9 shows a schematic block diagram of the output driver of FIG. 2, according to one possible implementation.

FIG. 9 shows a schematic block diagram of output driver 212 of FIG. 2, according to one possible implementation. Output driver 212 receives outgoing inverted data signal 902 and generates output drive signal 924 to be applied to the output pad via buffer protection circuit 214 of FIG. 2. The control signal Enable controls whether output driver 212 is programmably enabled (Enable=1) or disabled (Enable=0).

Output driver 212 includes pre-buffer circuit 910, which inverts and level-shifts outgoing inverted data signal 902 to maintain reliable and consistent performance of output driver 212. In particular, if AUXGTIO is high and outgoing inverted data signal 902 is low, then pre-buffer circuit 910 inverts and level-shifts Source signal 912 to VCCAUX. If AUXGTIO is high and outgoing inverted data signal 902 is high, then pre-buffer circuit 910 drives Source signal 912 low. If AUXGTIO is low, then pre-buffer circuit 910 drives Source signal 912 to VCCIO, independent of the value of outgoing inverted data signal 902.

In operation, assuming that output driver 212 is programmably enabled (i.e., Enable=1), if AUXGTIO is high and outgoing inverted data signal 902 is also high, then:
  The output of inverter 904 is low;
  Output signal 908 from NOR gate 906 is low;
  Pre-buffer circuit 910 drives Source signal 912 towards VCCAUX, which turns off PFET 914; and
  The output of AND gate 916 is high, which drives Sink signal 920 from buffer 918 high, which turns on NFET 922, which drives output drive signal 924 low.

If AUXGTIO is high and outgoing inverted data signal 902 is low, then:
  The output of AND gate 916 is low, which drives Sink signal 920 from buffer 918 low, which turns off NFET 922;
  The output of inverter 904 is low;
  Output signal 908 from NOR gate 906 is high; and
  Pre-buffer circuit 910 drives Source signal 912 towards ground, which turns on PFET 914, which drives output drive signal 924 towards VCCIO.

If AUXGTIO is low and outgoing inverted data signal 902 is high, then:
  The output of inverter 904 is low;
  Output signal 908 from NOR gate 906 is low;
  Pre-buffer circuit 910 drives Source signal 912 towards VCCIO, which turns off PFET 914; and
  The output of AND gate 916 is high, which drives Sink signal 920 from buffer 918 high, which turns on NFET 922, which drives output drive signal 924 low.

If AUXGTIO is low and outgoing inverted data signal 902 is also low, then:
  The output of AND gate 916 is low, which drives Sink signal 920 from buffer 918 low, which turns off NFET 922;
  The output of inverter 904 is low;
  Output signal 908 from NOR gate 906 is high; and
  Pre-buffer circuit 910 drives Source signal 912 towards VCCIO, which turns off PFET 914.

In this case, where AUXGTIO is low, output driver 212 is essentially dynamically disabled, and another output driver (not shown in either FIG. 1 or FIG. 2) is used to drive the I/O pad.

To summarize, assuming that output driver 212 is programmably enabled (i.e., Enable=1), if AUXGTIO is high (indicating that VCCIO is not sufficiently greater than VCCAUX), then output drive signal 924 will be driven based on outgoing inverted data signal 902. That is, if outgoing inverted data signal 902 is low, then output drive signal 924 is driven high (i.e., towards VCCIO). If outgoing inverted data signal 902 is high, then output drive signal 924 is driven low (i.e., towards ground).

If, however, AUXGTIO is low (indicating that VCCIO is sufficiently greater than VCCAUX), then output driver 212 is dynamically disabled. In that case, output drive signal 924 is either driven low or allowed to float, depending on the value of outgoing inverted data signal 902.

Figure 10:
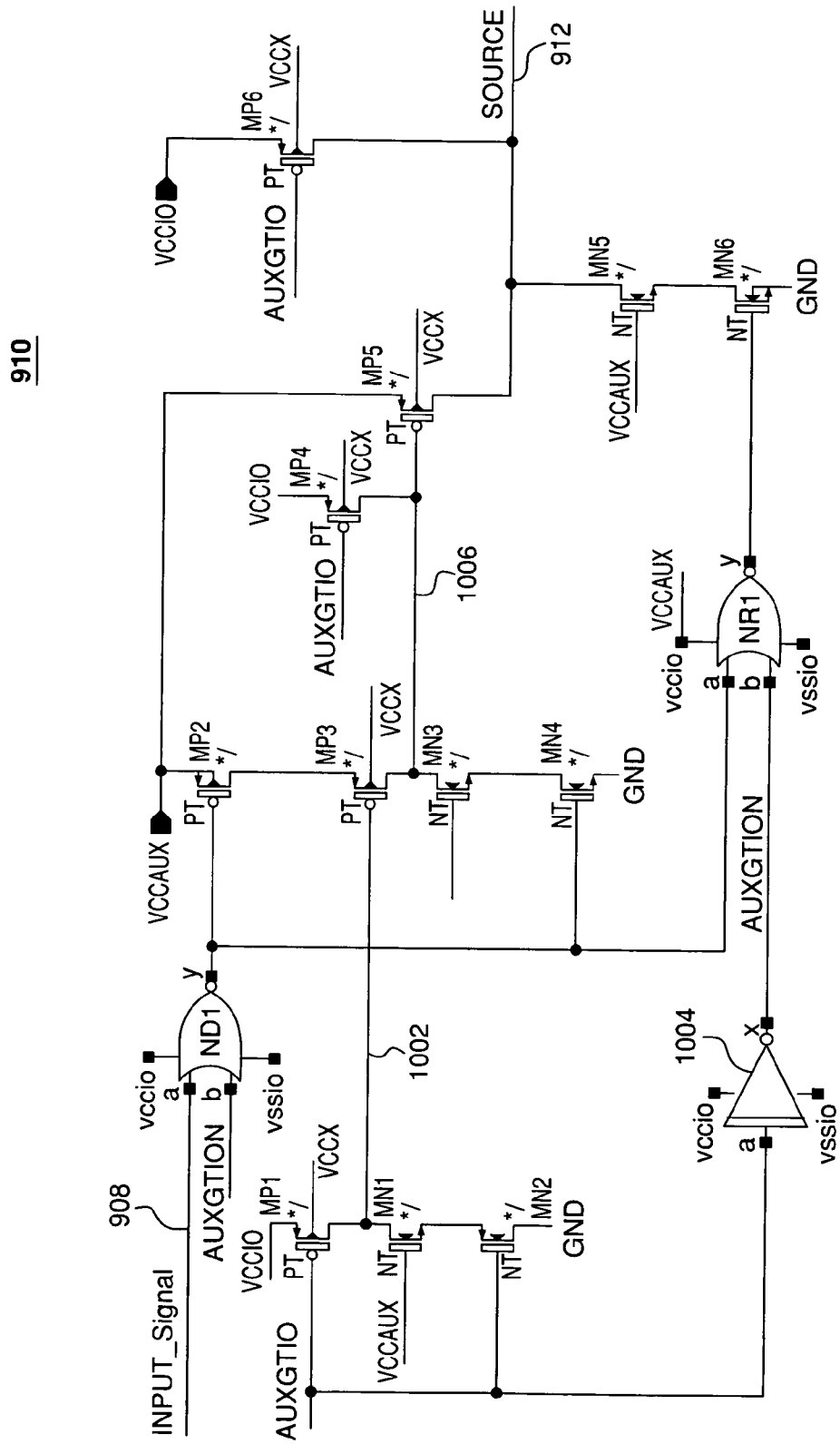
FIG. 10 is a circuit diagram of an exemplary implementation of the pre-buffer circuit of FIG. 9.

FIG. 10 is a circuit diagram of an exemplary implementation of pre-buffer circuit 910 of FIG. 9. Pre-buffer circuit 910 ensures reliable and consistent circuit performance for output driver 212 as power supply levels vary by providing the optimal power supply level for the output driver circuitry.

Operationally, as long as VCCAUX is sufficiently high, NFETs MN1, MN3, and MN5 will always be on. If AUXGTIO is high (indicating that VCCIO is not sufficiently greater than VCCAUX) and input signal 908 (from NOR gate 906 of FIG. 9) is also high, then:
  PFETs MP4 and MP6 will be off;
  PFET MP1 will be off and NFET MN2 will be on, which will drive node 1002 to ground (i.e., low), which will turn PFET MP3 on;
  Signal AUXGTION from inverter 1004 will be low;
  The output of NOR gate ND1 will be low, which will:
    Turn PFET MP2 on and NFET MN4 off, which will drive node 1006 to VCCAUX (i.e., high), which will turn PFET MP5 off; and
    Drive the output of NOR gate NR1 high, which will turn NFET MN6 on, which will drive Source signal 912 to ground.

If AUXGTIO is high and input signal 908 (from NOR gate 906 of FIG. 9) is low, then:
  PFETs MP4 and MP6 will be off;
  PFET MP1 will be off and NFET MN2 will be on, which will drive node 1002 to ground (i.e., low), which will turn PFET MP3 on;
  Signal AUXGTION from inverter 1004 will be low;
  The output of NOR gate ND1 will be high, which will:
    Drive the output of NOR gate NR1 low, which will turn NFET MN6 off; and
    Turn PFET MP2 off and NFET MN4 on, which will drive node 1006 to ground, which will turn PFET MP5 on, which will drive Source signal 912 to VCCAUX (i.e., high).

If AUXGTIO is low (indicating that VCCIO is sufficiently greater than VCCAUX), then:
- PFET MP1 will be on and NFET MN2 will be off, which will drive node 1002 to VCCIO (i.e., high), which will turn PFET MP3 off;
- Signal AUXGTION from inverter 1004 will be high;
- The output of NOR gate ND1 will be low (independent of the value of input signal 908), which will:
  - Drive the output of NOR gate NR1 low, which will turn NFET MN6 off; and
  - Turn PFET MP2 on and NFET MN4 off;
- PFET MP4 will be on, which will drive node 1006 towards VCCIO, which will turn PFET MP5 off; and
- PFET MP6 will be on, which will drive Source signal 912 to VCCIO.

The signal levels, gate outputs, and transistor states for these different operating scenarios for the circuitry of FIG. 10 are summarized in Table I of FIG. 11.

As known by those skilled in the art, the tub connections of PFET devices are usually tied to the associated power supply. If the power supply is lower than the source or drain, then an intrinsic diode in the device can turn on and start to draw current. In order to limit the occurrences of these undesirable intrinsic diode currents, as indicated in FIG. 10, VCCX (i.e., the greater of VCCIO and VCCAUX as selected by the circuitry of FIG. 8) is applied to the tubs of PFETs MP1, MP3, MP4, MP5, and MP6 to ensure that the highest available power supply is always applied to the PFET tubs. Limiting the occurrences of intrinsic diode currents advantageously limits disturbances to other devices during hot-plug situations.

Input signal adjuster 216 clips the input voltages received from the I/O pad that are forwarded to input receiver 218. As such, input receiver 218 can be driven by VCCIN (i.e., the lower of VCCIO and VCCAUX) and still operate properly.

Figure 12:
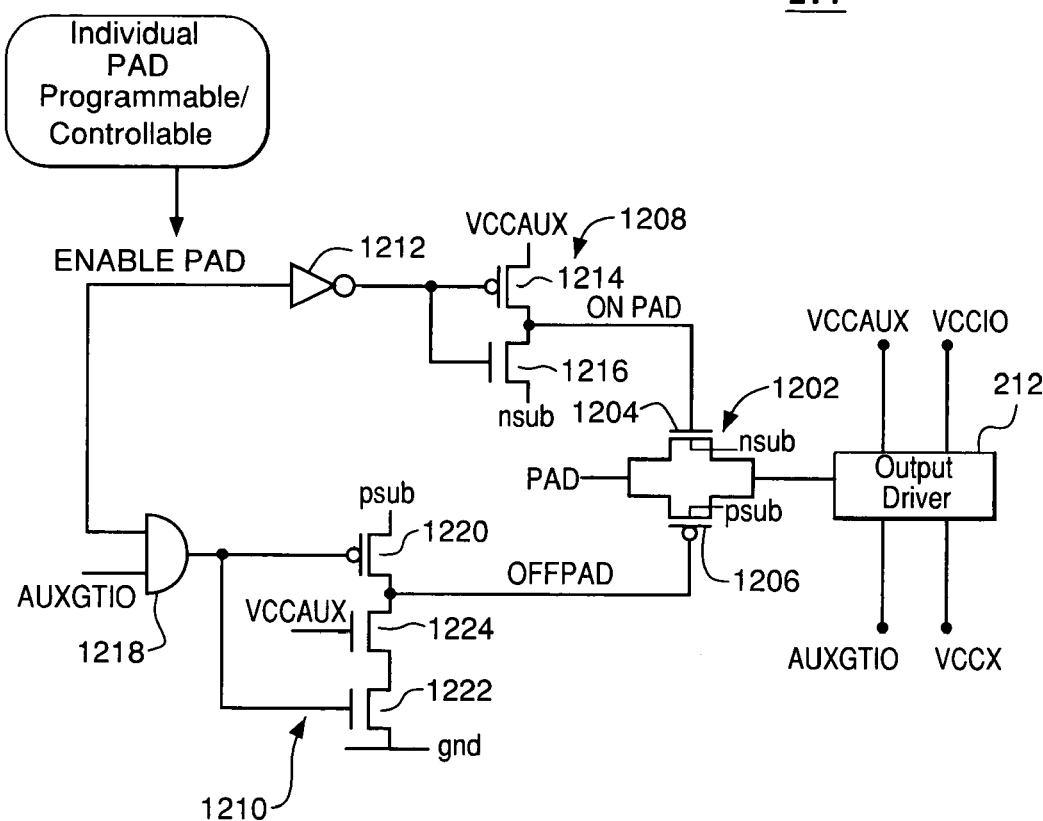
FIG. 12 shows a schematic circuit diagram of the buffer protection circuit in the I/O buffer of FIG. 2.

FIG. 12 shows a schematic circuit diagram of buffer protection circuit 214 of FIG. 2, according to one possible implementation, in which the buffer protection circuit is configured between output driver 212 and the corresponding I/O pad. Buffer protection circuit 214 has a transmission gate 1202, which selectively connects output driver 212 to the pad based on control signals ONPAD and OFFPAD. FIG. 12 shows the circuitry used to generate control signals ONPAD and OFFPAD, which are applied to the gates of NFET 1204 and PFET 1206, which form transmission gate 1202. As shown in FIG. 12, the circuitry for controlling transmission gate 1202 comprises two portions: one set of circuitry 1208 for controlling NFET 1204 and another set of circuitry 1210 for controlling PFET 1206.

NFET control circuitry 1208 receives (configuration) control signal ENABLEPAD, which dictates whether or not the pad is enabled. If ENABLEPAD is high, then the pad is enabled; otherwise, ENABLEPAD is low and the pad is disabled. In particular, if ENABLEPAD is high, then the output of inverter 1212 is low, which turns on PFET 1214 and turns off NFET 1216, which in turn drives node ONPAD towards VCCAUX, which turns on NFET 1204, thereby providing a connection between output driver 212 and the pad. If, however, ENABLEPAD is low, then the output of inverter 1212 is high, which turns off PFET 1214 and turns on NFET 1216, which in turn drives node ONPAD towards nsub, which turns off NFET 1204, thereby disabling that particular path between output driver 212 and the pad.

The signal nsub is generated and used to drive the substrate voltage of NFET 1204, where nsub is either the ground voltage or an intermediate voltage V1 which is selected when the pad signal voltage is greater than the maximum voltage tolerable by the devices. The nsub intermediate voltage V1 is at a voltage level that is high enough to protect the device from seeing an over-voltage condition across any of its nodes and low enough to keep NFET 1204 off when ENABLEPAD is low. More information on NFET control circuitry 1208 can be found in the 1054.035 and 1054.046 applications.

In addition to receiving control signal ENABLEPAD, PFET control circuitry 1210 also receives dynamic control signal AUXGTIO from dynamic monitor 106. In general, PFET 1206 is turned on, only when both ENABLEPAD is high (indicating that the pad is enabled) and AUXGTIO is high (indicating that the signal voltages are within the voltage tolerance of the devices used to implement output driver 212).

In particular, if either or both of ENABLEPAD and AUXGTIO are low, then the output of AND gate 1218 will also be low, which turns on PFET 1220 and turns off NFET 1222, which in turn drives node OFFPAD to psub, which turns PFET 1206 off. (Note that NFET 1224 is on, whenever VCCAUX is present on the IC.) In this case, the only available path between output driver 212 and the pad is through NFET 1204 (i.e., when AUXGTIO is low and ENABLEPAD is high).

If, however, both ENABLEPAD and AUXGTIO are high, then the output of AND gate 1218 will also be high, which turns off PFET 1220 and turns on NFET 1222, which in turn drives node OFFPAD to gnd, which turns PFET 1206 on, thereby providing a second path between output driver 212 and the pad (in addition to NFET 1204 which will also be on by virtue of ENABLEPAD being high).

Here, the signal psub is generated and used to drive the substrate voltage of PFET 1206, where psub is the higher voltage of the PFET power supply and the signal connected to the source or drain of the PFET. As such, psub is dynamic and tracks the voltage at the pad (PAD). If the PAD voltage is less than the power supply voltage, then psub is equal to the power supply voltage. If, however, the signal on the source or drain of the PFET is greater than the power supply, then psub is raised to the level of that signal. More information on this subject can be found in the 1054.035 application.

PFET control circuitry 1210 protects output driver 212 by providing a threshold reduction filter to the signal PAD, where the maximum voltage level at the output node of output driver 212 would be a threshold drop from the power supply. In particular, if the signal PAD is above a specific level, then it is chopped off. In this way, the pad can receive signals from sources that are outside the voltage range of the transistor technology used. Typically, higher voltage-level signals have larger swings. The over-voltage protection scheme protects I/O buffer 104 and its associated downstream circuitry by chopping off the high end of the input signal, if it is above the voltage range of the I/O buffer. This enables an I/O buffer implemented using a lower-voltage transistor technology (e.g., 2.5V or less) to support signaling standards having peak voltages (e.g., 3V or even higher) exceeding that of the transistor technology. For large input-signal amplitude, the duty cycle is minimally affected, if at all. This is due to the switch point of the I/O buffer, the larger amplitude of the higher-voltage input signals, and the fact that higher-voltage signaling standards typically run at slower speeds.

In general, if control signal AUXGTIO is low, then PFET 1206 is turned off and the PAD signal passes fully through NFET 1204 until it is within a threshold drop of the gate voltage on the NFET, at which point, the signal is chopped off. If AUXGTIO is high, then PFET 1206 is on and the PAD signal is passed through both sides of the transmission gate without distortion. As such, for higher-speed, lower-amplitude signaling, no detrimental effects occur.

Thus, control signal AUXGTIO determines whether gate 1202 operates as a full transmission gate or a pass gate by controlling whether PFET 1206 is on or off. When PFET 1206 is turned off, the voltage level that is passed through gate 1202 is reduced to a tolerable voltage level for the transistors in output driver 212.

Due to the presence of AND gate 1218, the processing of buffer protection circuit 214 is affected by AUXGTIO only after ENABLEPAD has been set. If ENABLEPAD is set prior to the completion of the configuration of the integrated device (as indicated by the DONE signal in FIG. 2), then dynamic monitor 106 assists in providing over-voltage protection via buffer protection circuit 214 as well as via switch module 210. After configuration is complete (i.e., the DONE signal is logic high), mux 208 of FIG. 2 selects the configuration setting for control signal AUXGTIO, and buffer protection circuit 214 will operate according to that configuration setting.

Input signal adjuster 216 employs an over-voltage protection scheme similar to the scheme shown in FIG. 12 for buffer protection circuit 214, but where the scheme is controlled programmably rather than dynamically, in which the unpowered default is with the protection scheme enabled.

Although the present invention has been described in the context of an interface circuit 100 having a bank 102 of one or more I/O buffers 104 in which each I/O buffer has its own power-supply switch module 210, the present invention can also be implemented in the context of an interface circuit having a single power-supply switch module, similar to switch module 210, connected to select power supplies for two or more or even all of the different I/O buffers in a bank.

Although the present invention has been described in the context of I/O circuitry that dynamically monitors the relative potential between two specific power supplies VCCAUX and VCCIO, the present invention is not so limited. In general, the present invention can be implemented in the context of dynamic monitors for any two or more power supplies.

The present invention has been described in the context of an integrated device having programmable I/O circuitry in which the I/O circuitry can be programmably configured (e.g., using device configuration memory) to support a number of different signaling applications, where the over-voltage protection scheme protects the I/O circuitry from over-voltage conditions that may occur before the device has been configured, such as during the power-on state. The present invention can also be implemented to provide over-voltage protection to non-programmable I/O circuitry. Note that, for non-programmable I/O circuitry, mux 208 of FIG. 2 may be omitted.

Furthermore, although the present invention has been described in the context of I/O circuitry that supports both input signaling and output signaling applications, the present invention can also be implemented in the context of interface circuitry that supports only input signaling and/or interface circuitry that supports only output signaling.

The present invention can be implemented in the context of any suitable type of integrated circuit device, such as, without limitation, application-specific integrated circuits (ASICs), field-programmable gate arrays (FPGAs), programmable logic devices (PLDs), mask-programmable gate arrays (MPGAs), simple programmable logic device (SPLDs), and complex programmable logic devices (CPLDs).

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. An integrated device having an interface circuit comprising:
    a monitor adapted to dynamically compare first and second power supplies in order to generate a dynamic control signal; and
    at least one switch module adapted to select, based on the dynamic control signal, one of the first and second power supplies for use in powering at least one input/output (I/O) component of the interface circuit, wherein the monitor comprises:
        a bias circuit adapted to generate a reduced switch-point voltage level based on the second power supply;
        a dynamic comparator adapted to compare the switch-point voltage level to the first power supply to generate at least one intermediate control signal indicative of whether the first power supply is greater than the second power supply by a predetermined amount;
        a signal driver adapted to generate an other intermediate control signal based on the at least one intermediate control signal, wherein the dynamic control signal is generated based on the other intermediate control signal; and
        a mux adapted to generate the dynamic control signal based on either the other intermediate control signal or a configuration setting, wherein:
            the mux selects the other intermediate control signal before configuration of the integrated device is complete; and
            the mux selects the configuration setting after the configuration of the integrated device is complete.

2. The invention of claim 1, wherein the monitor and the at least one switch module are adapted to protect the at least one I/O component from the over-voltage condition prior to the integrated device being completely configured.

3. The invention of claim 2, wherein:
    the interface circuit is a programmable interface circuit; and the monitor and the at least one switch module are adapted to protect the at least one I/O component from the over-voltage condition prior to the programmable interface circuit being programmed.

4. The invention of claim 1, wherein:

the at least one I/O component comprises an output driver;

if the level of the first power supply is greater than the level of the second power supply by a predetermined amount, then the monitor generates the dynamic control signal to control the switch module to select the second power supply for use in powering the output driver; and if the level of the first power supply is not greater than the level of the second power supply by the predetermined amount, then the monitor generates the dynamic control signal to control the switch module to select the first power supply for use in powering the output driver.

5. The invention of claim 1, wherein:

the at least one I/O component comprises an input receiver;

if the level of the first power supply is greater than the level of the second power supply by a predetermined amount, then the monitor generates the dynamic control signal to control the switch module to select the first power supply for use in powering the input receiver; and if the level of the first power supply is not greater than the level of the second power supply by the predetermined amount, then the monitor generates the dynamic control signal to control the switch module to select the second power supply for use in powering the input receiver.

6. The invention of claim 1, wherein:

the interface circuit has a single monitor and a plurality of I/O buffers; and the single monitor and the at least one switch module control selection of power supplies for use in powering at least one I/O component in each of the I/O buffers.

7. The invention of claim 1, wherein the monitor comprises:

a bias circuit adapted to generate a reduced switch-point voltage level based on the second power supply;

a dynamic comparator adapted to compare the switch-point voltage level to the first power supply to generate at least one intermediate control signal indicative of whether the first power supply is greater than the second power supply by a predetermined amount; and a signal driver adapted to generate an other intermediate control signal based on the at least one intermediate control signal, wherein the dynamic control signal is generated based on the other intermediate control signal.

8. The invention of claim 7, wherein:

a logic-high state of the at least one intermediate control signal is based on the first power supply; and the signal driver is adapted to perform level-shifting such that a logic-high state of the other configuration control signal is based on the second power supply.

9. The invention of claim 1, wherein:

the interface circuit is a programmable interface circuit;

the monitor is adapted to generate the dynamic control signal to control the at least one switch module to select a power supply that protects the at least one I/O component from an over-voltage condition prior to the programmable interface circuit being programmed;

the interface circuit has a single monitor and a plurality of I/O buffers; and the single monitor and the at least one switch module control selection of power supplies for use in powering at least one I/O component in each of the I/O buffers.

* * * * *